United States Patent
Park et al.

(10) Patent No.: US 11,978,827 B2
(45) Date of Patent: May 7, 2024

(54) OPTICAL DEVICE AND MANUFACTURING METHOD THEREOF

(71) Applicant: SAMSUNG ELECTRONICS CO., LTD., Suwon-si (KR)

(72) Inventors: Changyoung Park, Yongin-si (KR); Sanghun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/976,419

(22) Filed: Oct. 28, 2022

(65) Prior Publication Data

US 2023/0085092 A1 Mar. 16, 2023

Related U.S. Application Data

(62) Division of application No. 17/217,552, filed on Mar. 30, 2021, now Pat. No. 11,817,527.

(30) Foreign Application Priority Data

Dec. 3, 2020 (KR) .................. 10-2020-0167657

(51) Int. Cl.
 *H01L 33/30* (2010.01)
 *H01L 33/00* (2010.01)
 *H01L 33/04* (2010.01)
 *H01L 33/58* (2010.01)

(52) U.S. Cl.
 CPC .......... *H01L 33/30* (2013.01); *H01L 33/0066* (2013.01); *H01L 33/04* (2013.01); *H01L 33/58* (2013.01)

(58) Field of Classification Search
 CPC ... H01L 33/0066; H01L 33/007; H01L 33/04; H01L 33/06; H01L 33/30; H01L 33/58
 See application file for complete search history.

(56) References Cited

U.S. PATENT DOCUMENTS

| 4,928,154 | A | * | 5/1990 | Umeno | ............ | H01L 21/02573 |
| | | | | | | 257/E29.081 |
| 5,075,743 | A | * | 12/1991 | Behfar-Rad | ........... | B82Y 20/00 |
| | | | | | | 257/97 |
| 6,717,974 | B2 | | 4/2004 | Zhang | | |
| 10,720,756 | B2 | | 7/2020 | Choi | | |

(Continued)

FOREIGN PATENT DOCUMENTS

| JP | 2004-95827 A | 3/2004 |
| JP | 2006-54277 A | 2/2006 |
| KR | 10-2056896 B1 | 12/2019 |

OTHER PUBLICATIONS

R. Alcotte et al., "Epitaxial growth of antiphase boundary free GaAs layer on 300 mm Si(001) substrate by metalorganic chemical vapour deposition with high mobility," APL Materials, vol. 4, No. 046101, Apr. 2016, Total 7 pages.

*Primary Examiner* — Julia Slutsker
*Assistant Examiner* — Dmitriy Yemelyanov
(74) *Attorney, Agent, or Firm* — Sughrue Mion, PLLC

(57) ABSTRACT

An optical device includes a multilayered GaAs structure including a plurality of sublayers and an optical structure layer on the multilayered GaAs structure, the optical structure layer including a Group III-V compound semiconductor material. The optical structure layer may be, for example, a light-emitting layer having a multi-quantum well structure.

9 Claims, 9 Drawing Sheets

(56) References Cited

U.S. PATENT DOCUMENTS

2016/0141836 A1 5/2016 Leobandung et al.
2016/0293764 A1* 10/2016 Ban ................. H01L 21/823807
2017/0033261 A1 2/2017 Kim et al.

* cited by examiner

OPTICAL DEVICE AND MANUFACTURING METHOD THEREOF

CROSS-REFERENCE TO RELATED APPLICATION

This application is a Divisional application of U.S. application Ser. No. 17/217,552 filed Mar. 30, 2021, which is based on and claims priority under 35 U.S.C. § 119 to Korean Patent Application No. 10-2020-0167657, filed on Dec. 3, 2020, in the Korean Intellectual Property Office, the disclosures of which are incorporated by reference herein in their entireties.

BACKGROUND

1. Field

Example embodiments of the present disclosure relates to optical devices and methods of manufacturing the optical devices.

2. Description of Related Art

Optical devices having a light-emitting structure are applied in various forms, such as a display of a notebook computer, a display of a mobile device, and a light source of an automobile. For example, a GaAs-based optical device may be manufactured by crystal-growing a light-emitting structure on a GaAs substrate. The cost of an optical device may depend on the size of a wafer (substrate) used in a manufacturing process. If the size of a wafer is small, the number of optical devices obtained in a single process is small, and thus, the unit cost of the optical device may increase. Also, the price of an optical device may depend on the price of a wafer used in a manufacturing process.

SUMMARY

Example embodiments provide GaAs-based optical devices having a structure capable of reducing cost by using a large-area wafer and methods of manufacturing the GaAs-based optical devices.

Additional aspects will be set forth in part in the description which follows and, in part, will be apparent from the description, or may be learned by practice of the presented embodiments of the disclosure.

In accordance with an aspect of an example embodiment, an optical device includes a multilayered GaAs structure; and an optical structure layer on the multilayered GaAs structure, the optical structure layer including a Group III-V compound semiconductor material.

The multilayered GaAs structure may include a first GaAs layer and a second GaAs layer stacked on the first GaAs layer.

The optical device may further include a substrate; and a lattice matching layer between the substrate and the multilayered GaAs structure.

The substrate may include a Si substrate.

The lattice matching layer may include at least one of Ge and GaP.

A crystal direction of the Si substrate may be inclined in a range of about 1° to about 35° with respect to a surface of the Si substrate.

The optical structure layer may include a light-emitting layer configured to generate light.

The Group III-V compound semiconductor material may include at least one of GaInP, AlGaInP, GaAs, GaInAs, AlGaAs, and AlGaInAs.

The light-emitting layer may be configured to generate light in a wavelength range of about 600 nm to about 1050 nm.

The light-emitting layer may include a plurality of light-emitting layers stacked in a vertical direction.

The plurality of light-emitting layers may include a first light-emitting layer configured to generate light having a first wavelength range, and a second light-emitting layer configured to generate light having a second wavelength range that is different that is different from the first wavelength range.

In accordance with an aspect of an example embodiment, a method of manufacturing an optical device includes forming a multilayered GaAs structure on a substrate by growing at least two GaAs layers, wherein a first condition during growing a first GaAs layer of the at least two GaAs layers is different from a second condition during growing a second GaAs layer of the at least two GaAs layers, and each of the first condition and the second condition includes at least one of a pressure and a temperature; and forming a light-emitting layer by growing a Group III-V compound semiconductor material on the multilayered GaAs structure.

In the forming the multilayered GaAs structure, the pressure may be lowered from growing a lowermost GaAs layer of the at least two GaAs layers to growing an uppermost GaAs layer of the at least two GaAs layers.

The forming the multilayered GaAs structure may include forming the first GaAs layer under a first pressure condition; and forming the second GaAs layer on the first GaAs layer under a second pressure condition lower than the first pressure condition.

The method may further include forming a lattice matching layer on the substrate to mitigate a lattice mismatch between the substrate and the multilayered GaAs structure.

The substrate may include a Si substrate, and the lattice matching layer may include at least one of a Ge layer and a GaP layer.

A crystal direction of the Si substrate may be inclined in a range of about 1° to about 35° with respect to a surface of the substrate.

The light-emitting layer may include a multi-quantum well structure.

The Group III-V compound semiconductor material may include at least one of GaInP, AlGaInP, GaAs, GaInAs, AlGaAs, and AlGaInAs.

The forming the light-emitting layer may include forming a plurality of light-emitting layers stacked in a vertical direction on the multilayered GaAs structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
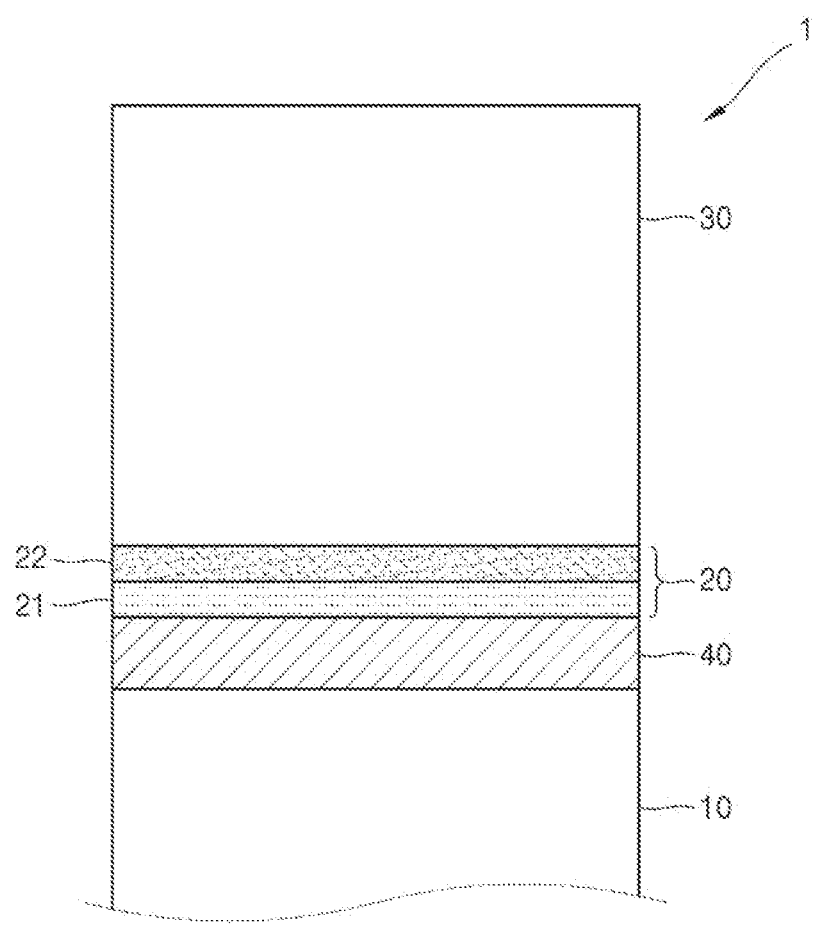
FIG. 1 is a cross-sectional view showing a schematic structure of an optical device according to an example embodiment.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The disclosure may be modified into various forms and may have various embodiments. The advantages, features, and methods of achieving the advantages of the disclosure may be clear when referring to example embodiments described below together with the drawings. However, the disclosure may have different forms and should not be construed as being limited to the descriptions set forth herein.

In the drawings, like reference numerals are used for elements that are substantially identical or correspond to each other, and the descriptions thereof will not be repeated.

It will be understood that, although the terms "first", "second", etc., may be used herein to describe various elements, these elements should not be limited by these terms. These terms are only used to distinguish one element from another.

In the following embodiments, the singular forms include the plural forms unless the context clearly indicates otherwise.

In the following embodiments, it will be understood that the terms "include," "comprise," "including," and/or "comprising," when used in this specification, specify the presence of stated features, and/or components, but do not preclude the presence or addition of one or more other features, and/or components, and/or groups thereof.

It will be understood that when an element or layer is referred to as being "on" another element or layer, the element or layer may be directly on another element or layer or intervening elements or layers.

Sizes of elements in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a schematic cross-sectional view showing a structure of an optical device 1 according to an example embodiment. Referring to FIG. 1, the optical device 1 may include a multilayered GaAs structure 20 and an optical structure layer 30 on the multilayered GaAs structure 20. The optical structure layer 30 may include a Group III-V compound semiconductor material. The optical structure layer 30 may include any one or more of various optical structure layers that include a Group III-V compound semiconductor material and may be manufactured based on GaAs, such as an LED light-emitting layer, a laser light-emitting layer, a light detection layer, a photoelectric conversion layer of a solar cell, and a light modulation layer of a light modulator.

A lattice matching layer 40 may be between a substrate 10 and the multilayered GaAs structure 20. The lattice matching layer 40 mitigates lattice mismatch between the substrate 10 and the multilayered GaAs structure 20. Anti-phase boundary (APB) dislocation may be effectively reduced by forming the multilayered GaAs structure 20 on the lattice matching layer 40. For example, when a Si substrate is employed as the substrate 10, the lattice matching layer 40 may include Ge or GaP. The lattice matching layer 40 may have a single layer structure including Ge or GaP. Of course, the lattice matching layer 40 may have a multilayer structure including Ge or GaP. In order to effectively reduce the APB dislocation, the substrate 10 may be a substrate in which a crystal direction is inclined within a range of about 1° to about 35°.

Hereinafter, example embodiments in which an LED light-emitting layer is employed as the optical structure layer 30 will be described, and, for convenience of description, the optical structure layer 30 is indicated as a light-emitting layer 30. For example, in order to implement light in a wavelength range of about 600 nm to about 1050 nm (red light to near infrared light), the light-emitting layer 30 may include at least one of GaInP, AlGaInP, GaAs, GaInAs, AlGaAs and AlGaInAs.

Figure 2:
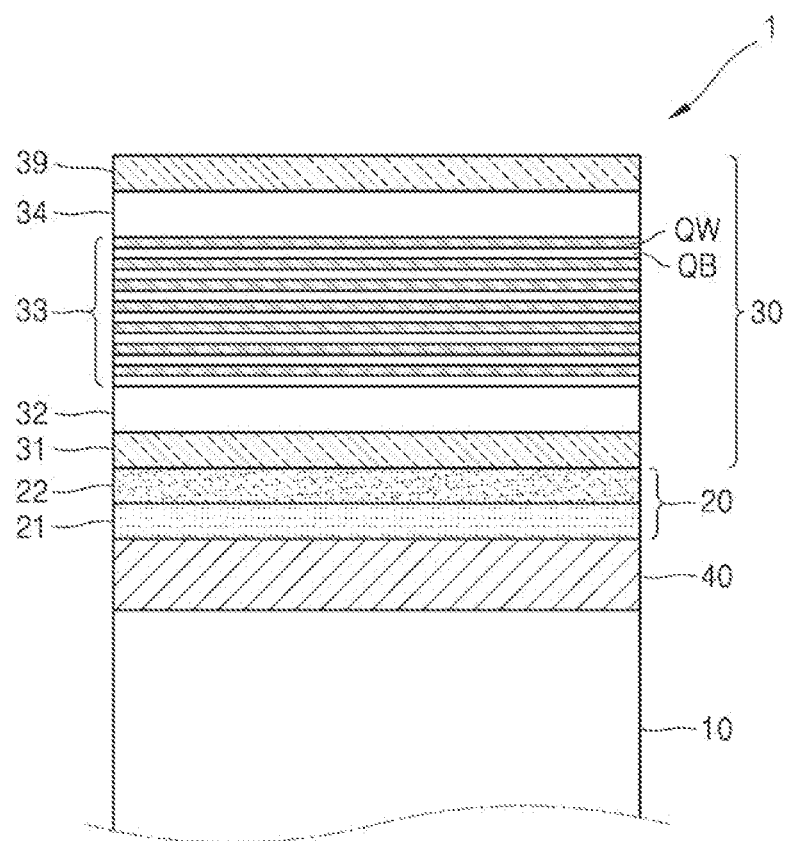
FIG. 2 is a schematic cross-sectional view of an optical device employing a light-emitting layer according to an example embodiment.

FIG. 2 is a schematic cross-sectional view of the optical device 1 employing the light-emitting layer 30. Referring to FIG. 2, the light-emitting layer 30 may have a multi-quantum well structure 33. The light-emitting layer 30 may include first and second clad layers 32 and 34 respectively arranged below and above the multi-quantum well structure 33. A first contact layer 31 may be arranged under the first clad layer 32, and a second contact layer 39 may be arranged on the second clad layer 34. The first and second clad layers 32 and 34 respectively may be an n-clad layer and a p-clad layer, and the first and second contact layers 31 and 39 respectively may be an n-contact layer and a p-contact layer.

The multi-quantum well structure 33 may include a quantum well layer QW and a quantum barrier layer QB that are alternately stacked. As a material of the quantum well layer QW and the quantum barrier layer QB, a material capable of lattice matching with the multilayered GaAs structure 20 may be selected. To this end, the quantum barrier layer QB may include a semiconductor material that has a band gap energy greater than that of the multilayered GaAs structure 20 and that receives tensile strain from the multilayered GaAs structure 20, and the quantum well layer QW may include a semiconductor material that has a band gap energy less than that of the multilayered GaAs structure 20 and that receives compressive strain from the multilayered GaAs structure 20. When a lattice constant of the quantum barrier layer QB formed on the multilayered GaAs structure 20 is less than that of the multilayered GaAs structure 20, the quantum barrier layer QB receives tensile stress from the multilayered GaAs structure 20. Accordingly, the quantum barrier layer QB may include a semiconductor material having a lattice constant less than that of the multilayered GaAs structure 20. When the lattice constant of the quantum well layer QW formed on the multilayered GaAs structure 20 is greater than that of the multilayered GaAs structure 20, the quantum well layer QW receives compressive stress from the multilayered GaAs structure 20. Therefore, the quantum well layer QW may include a semiconductor material having a lattice constant less than that of the multilayered GaAs structure 20. In the multi-quantum well structure 33 including the quantum barrier layer QB and the quantum well layer QW having such a lattice constant relationship, the tensile stress and the compressive stress are relaxed, and thus, a lattice match between the multi-quantum well structure 33 and the multilayered GaAs structure 20 may be achieved. A composition ratio of the semiconductor material included in the quantum barrier layer QB and the quantum well layer QW may be appropriately selected so as to achieve lattice matching with the multilayered GaAs structure 20. For example, the quantum well layer QW and the quantum barrier layer QB may be selected from GaAs, $GaIn_xAs$ ($0.05 \leq x \leq 0.35$), $GaInxP$ ($0.3 \leq x \leq 0.7$), $Al_yGaIn_xP$ ($0.3 \leq x \leq 0.7$ and $0.05 \leq y \leq 0.95$), $Al_yGaAs$ ($0.05 \leq y \leq 0.95$), $GaAs_zP$ ($0.4 \leq z \leq 0.95$), or $AlAs_zP$ ($0.4 \leq z \leq 0.95$). For example, when light (red light) in a wavelength range of about 600 nm to about 690 nm is generated, a multi-quantum well structure 33 having a GaInP-quantum well layer QW and an AlGaInP-quantum barrier layer QB may be applied. For example, when light (near infrared light) in the wavelength range of about 690 nm to about 1050 nm is generated, a multi-quantum well structure 33 having a GaAs-quantum well layer QW and an AlGaAs-quantum barrier layer QB may be applied.

Each of the first and second clad layers 32 and 34 may include the same material as the quantum barrier layer QB. For example, when the multi-quantum well structure 33 of GaInP/AlGaInP is applied, the first and second clad layers 32 and 34 may include AlGaInP. For example, when the multi-quantum well structure 33 of GaAs/AlGaAs is applied, the first and second clad layers 32 and 34 may include AlGaAs. The first and second contact layers 31 and 39 may include a conductive material. In FIG. 2, the first and second contact layers 31 and 39 are arranged below and on the first and second clad layers 32 and 34, respectively, but the positions of the first and second contact layers 31 and 39 are not limited thereto.

In the optical device 1 according to an example embodiment, the light-emitting layer 30 is arranged on the multilayered GaAs structure 20. The multilayered GaAs structure 20 functions as a buffer layer that is a basis for crystal-growing of the light-emitting layer 30. Therefore, unlike an optical device of the related art in which a light-emitting layer is formed on a GaAs substrate, the multilayered GaAs structure 20 may be grown on the substrate 10 and the light-emitting layer 30 may be grown on the multilayered GaAs structure 20. According to the configuration described above, various materials may be used as the substrate 10. For example, the substrate 10 may include a Si substrate, a glass substrate, or the like. The Si substrate and the glass substrate may reduce the cost of the optical device 1 compared to a process using a relatively expensive GaAs substrate. In an example embodiment, the substrate 10 may be a Si substrate.

The optical device 1 according to an example embodiment employs the multilayered GaAs structure 20. The multilayered GaAs structure 20 may include two or more GaAs layers stacked in a thickness direction of the substrate 10. Each of the GaAs layers may have a different crystal state. Here, the different crystal state may denote that, for example, at least one of crystal density, crystal arrangement, and crystal orientation is different. The plurality of GaAs layers having different crystal states may be implemented by varying different crystal-growing conditions. For example, each GaAs layer may be a layer epitaxially grown under a condition in which at least one of pressure and temperature is different from that of the other layer or layers. For example, each GaAs layer may be a layer epitaxially grown under different pressure conditions. The pressure condition may be gradually reduced from a lower layer (i.e., lower sublayer) to an upper layer (i.e., upper sublayer). The plurality of GaAs layers formed by varying pressure conditions may have different densities (e.g., crystal densities). For example, a lower GaAs layer may be a high density GaAs layer, and an upper GaAs layer may be a low density GaAs layer. The density may gradually decrease from the lower layer to the upper layer. Through scanning electron microscope (SEM) or transmission electron microscope (TEM) analysis, the density change of the multilayered GaAs structure 20, which is sequentially epitaxially grown by varying the pressure conditions, may be confirmed. According to the configuration described above, the multilayered GaAs structure 20 having a high-quality surface state may be obtained, and a high-quality light-emitting layer 30 including a Group III-V compound semiconductor material may be epitaxially grown on the multilayered GaAs structure 20. As an example, the multilayered GaAs structure 20 may include a first GaAs layer 21 and a second GaAs layer 22 sequentially stacked on the first GaAs layer 21. The first GaAs layer 21 is a lower layer, and the second GaAs layer 22 is arranged on the first GaAs layer 21. The first GaAs layer 21 may be a layer formed under a greater pressure condition than the second GaAs layer 22. The first GaAs layer 21 may be a high density GaAs layer, and the second GaAs layer 22 may be a low density GaAs layer.

Figure 3:
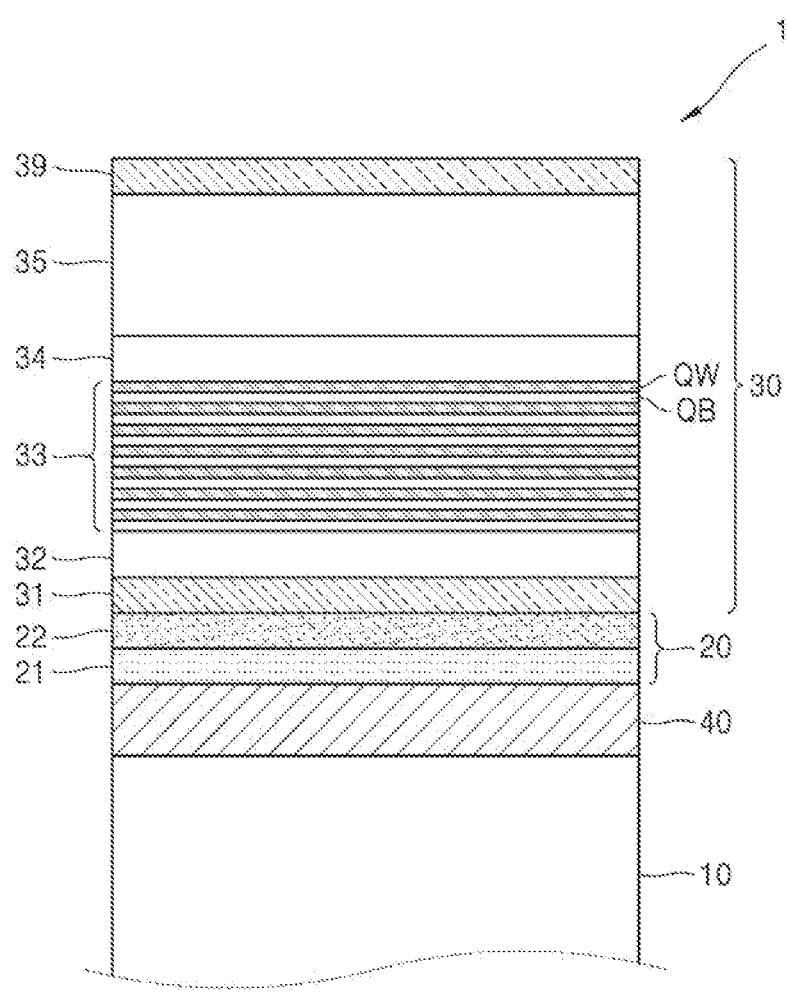
FIG. 3 is a schematic cross-sectional view of an optical device employing a light-emitting layer according to an example embodiment.

FIG. 3 is a schematic cross-sectional view of the optical device 1 employing the light-emitting layer 30 according to an example embodiment. Referring to FIG. 3, a current spreading layer 35 is between the second contact layer 39 and the multi-quantum well structure 33. The current spreading layer 35 is provided to facilitate the injection of a current from the second contact layer 39 into the multi-quantum well structure 33. The current spreading layer 35 may include a Group III-V compound semiconductor material, for example, GaP, GaAs, $GaInxP$ ($0.3 \leq x \leq 0.7$), $Al_yGaAs$ ($0.05 \leq y \leq 0.95$), $Al_yIn_xP$ ($0.3 \leq x \leq 0.7$ and $0.05 \leq y \leq 0.95$), etc. The current spreading layer 35 may be doped p-type or n-type. As a dopant, for example, Si, Zn, C, Mg, etc. may be used.

Figure 4:
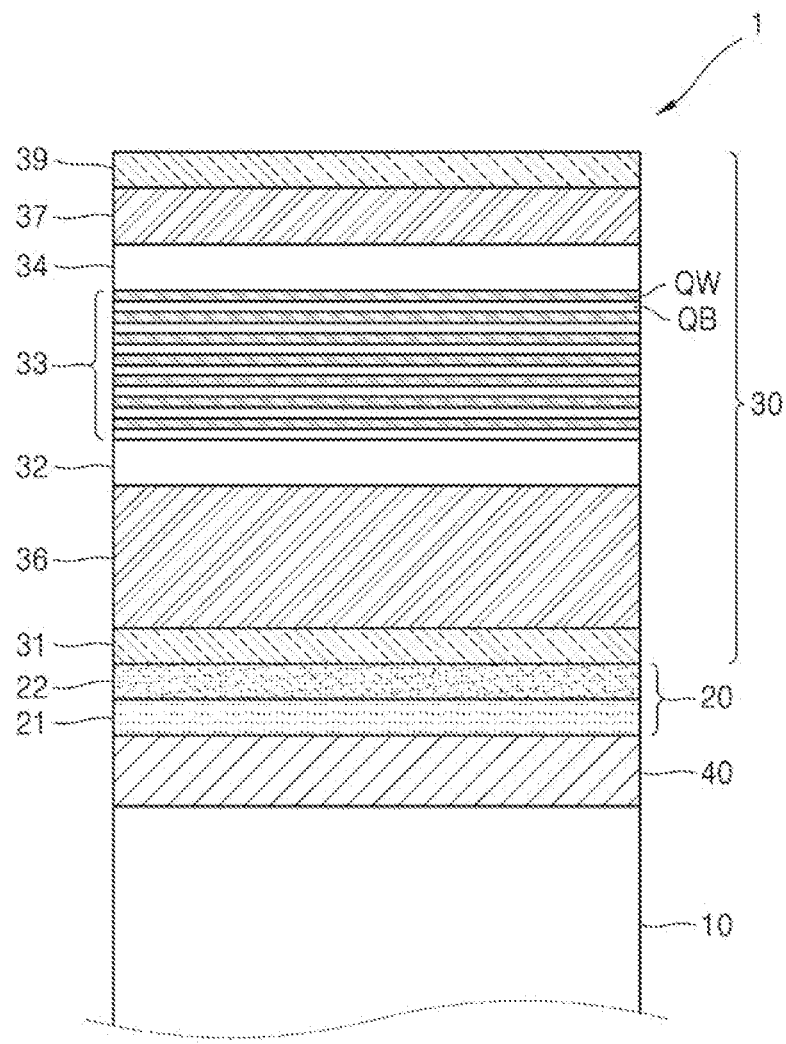
FIG. 4 is a schematic cross-sectional view of an optical device employing a light-emitting layer according to an example embodiment.

FIG. 4 is a schematic cross-sectional view of the optical device 1 employing the light-emitting layer 30, according to an example embodiment. Referring to FIG. 4, in order to improve light extraction efficiency, the light-emitting layer 30 may further include first and second reflective layers 36 and 37. The first reflective layer 36 may be between the first contact layer 31 and the first clad layer 32. The second reflective layer 37 may be between the second contact layer 39 and the second clad layer 34. When the current spreading layer 35 is applied as in the example embodiment described with reference to FIG. 3, the second reflective layer 37 may be between the second contact layer 39 and the current spreading layer 35. For example, the first and second reflective layers 36 and 37 may include a Group III-V compound semiconductor material. The first and second reflective layers 36 and 37 may be doped to simultaneously perform as a reflective layer and an electrical path. For example, the first reflective layer 36 may be doped n-type, and the second reflective layer 37 may be doped p-type.

The first and second reflective layers 36 and 37 may be, for example, a distributed Bragg reflector (DBR) in which a low refractive index layer having a relatively low refractive index and a high refractive index layer having a relatively high refractive index are alternately stacked. Reflection at an interface between a high refractive index layer HR and a low refractive index layer LR may occur, and a high reflectance may be obtained by making a phase difference of all reflected light equal. In addition, the reflectance may be controlled as desired according to the number of stacked pairs of the high refractive index layer HR and the low refractive index layer LR. For example, the first and second reflective layers 36 and 37 may be formed by alternately stacking $Al_{y1}GaAs$ ($0 \leq y1 \leq 0.95$) and $Al_{y2}GaAs$ ($0.05 \leq y2 \leq 1$). As a dopant, for example, Si, Zn, C, Mg, etc. may be used.

Figure 5:
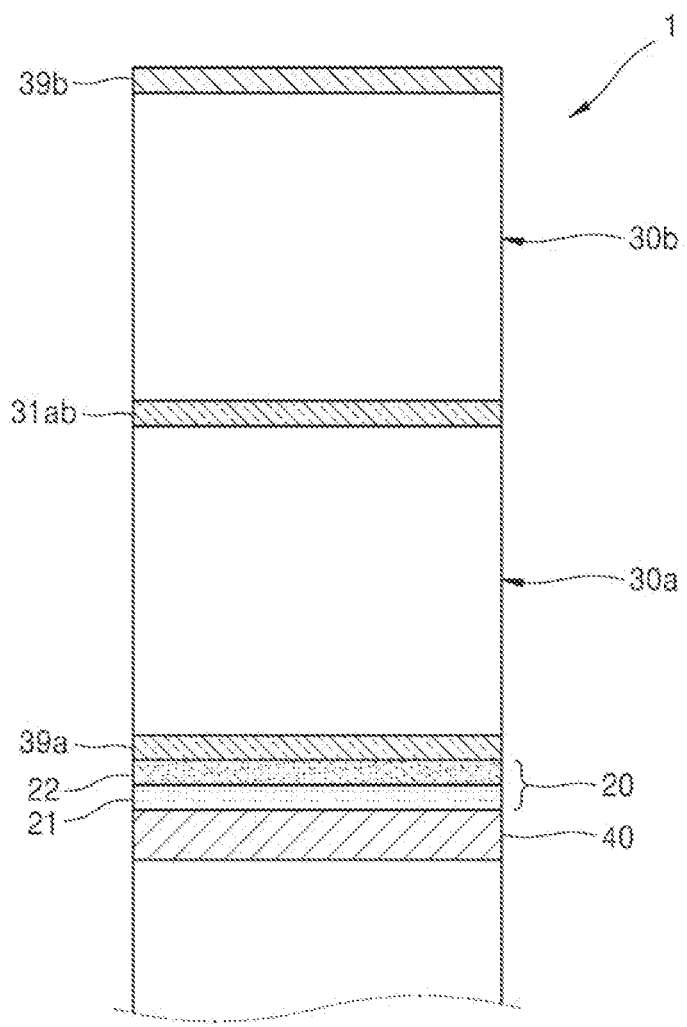
FIG. 5 is a schematic cross-sectional view of an optical device employing a light-emitting layer according to an example embodiment.

The optical device 1 may include a plurality of light-emitting layers 30 stacked in a vertical direction, that is, in a thickness direction of the optical device 1. FIG. 5 is a schematic cross-sectional view of the optical device 1 according to an example embodiment. Referring to FIG. 5, the optical device 1 may include first and second light-emitting layers 30a and 30b stacked in a vertical direction. The structures of the first and second light-emitting layers 30a and 30b may be the same as those of the optical device 1 described with reference to FIGS. 2 to 4. The first and second light-emitting layers 30a and 30b may share a first contact layer 31ab. The first and second light-emitting layers 30a and 30b respectively may have second contact layers 39a and 39b. The first contact layer 31ab may be a common electrode, and the second contact layers 39a and 39b may be driving electrodes. Although not shown in the drawings, the optical device 1 may include three or more light-emitting layers 30 as necessary. The first and second light-emitting layers 30a and 30b may generate light of different wavelength ranges. For example, the first light-emitting layer 30a may generate light in a wavelength range of about 600 nm to about 690 nm, and the second light-emitting layer 30b may generate light in a wavelength range of about 690 nm to about 1050 nm.

Figure 6A:
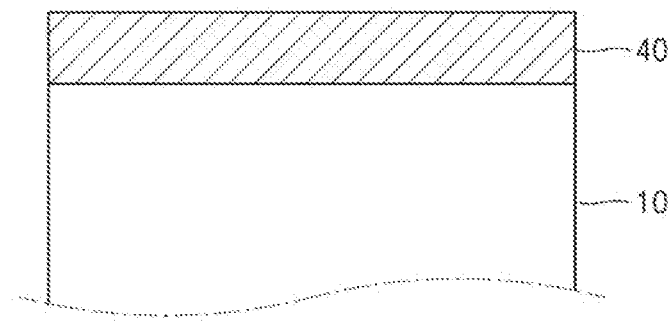
FIGS. 6A to 6C show an example of a method of manufacturing an optical device, according to an example embodiment.
Figure 6B:
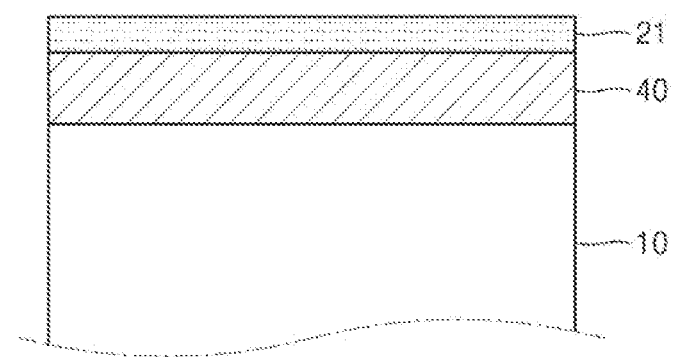
Figure 6C:
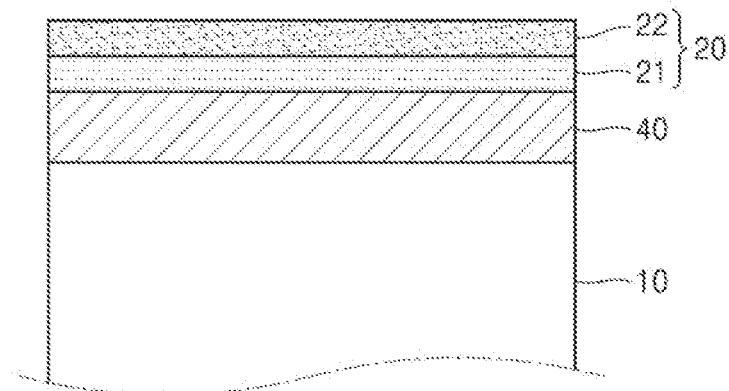

Hereinafter, a method of manufacturing the optical device 1 according to an example embodiment will be described. FIGS. 6A to 6C show a method of manufacturing the optical device 1 according to an example embodiment. Referring to FIGS. 6A to 6C, the method of manufacturing the optical device 1, according to an example embodiment, includes an operation of forming a multilayered GaAs structure 20 by growing GaAs on a substrate 10 under a condition in which at least one of pressure and temperature is different, and an operation of forming a light-emitting layer 30 by growing a Group III-V compound semiconductor material on the multilayered GaAs structure 20. In other words, at least one of pressure and temperature during growth of the first GaAs layer 21 of the multilayered GaAs structure 20 is different from the at least one of pressure and temperature during growth of the second GaAs layer 22 of the multilayered GaAs structure 20.

In related art, a Group III-V compound semiconductor material is crystal-grown on a GaAs substrate. The GaAs substrate may be manufactured in the form of a wafer of up to 6 inches, but in an actual process, a GaAs substrate in the form of a wafer of 3 to 4 inches is mainly used. In addition, the GaAs substrate is fragile and expensive. A structure capable of crystal-growing the light-emitting layer 30 including a Group III-V compound semiconductor material is required by using a material that is relatively strong and inexpensive compared to the GaAs substrate as a substrate.

In the optical device 1 according to an example embodiment, the light-emitting layer 30 is arranged on the multilayered GaAs structure 20. According to the configuration described above, the multilayered GaAs structure 20 may be grown on the substrate 10 and the light-emitting layer 30 may be grown on the multilayered GaAs structure 20. As the substrate 10, substrates of various materials may be used. For example, the substrate 10 may include a Si substrate, a glass substrate, or the like. Because the Si substrate and the glass substrate may be provided in the form of a large-area wafer of 6 inches or more, for example, 8 inches or more, a large-area processing is possible, and thus, the cost of the optical device 1 compared to the process using a GaAs substrate may be reduced. In addition, the GaAs substrate is weak in strength and may be damaged during a process. According to an example embodiment, because a Si substrate, a glass substrate, etc., which are relatively stronger than a GaAs substrate, may be used, the process yield may be improved. For example, the substrate 10 may include a Si substrate.

The multilayered GaAs structure 20 is a buffer layer that is a basis for crystal-growing of the light-emitting layer 30. The surface quality of the buffer layer affects crystal-growing of the light-emitting layer 30. When the surface roughness of the buffer layer is high, defects may occur during crystal-growing of the Group III-V compound semiconductor material for forming the light-emitting layer 30, and the yield of the optical device 1 may be reduced. In view of this point, the optical device 1 according to an example embodiment employs the multilayered GaAs structure 20. The multilayered GaAs structure 20 may include two or more GaAs layers stacked in a thickness direction of the substrate 10. Each of the GaAs layers may be a layer having different growth conditions. In other words, each GaAs layer is a layer crystal-grown in which at least one of pressure and temperature during growth is different from the other. For example, each GaAs layer may be a layer crystal-grown under different pressure conditions. For example, a pressure condition of the lower GaAs layer may be higher than a pressure condition of the upper GaAs layer. The multilayered GaAs structure 20 may be three or more layers. In this case, the pressure condition may gradually decrease from the lower layer to the upper layer. As an example, the multilayered GaAs structure 20 may include a first GaAs layer 21 and a second GaAs layer 22 sequentially stacked. The first GaAs layer 21 is a lower layer, and the second GaAs layer 22 is arranged on the first GaAs layer 21. The first GaAs layer 21 may be formed under a first pressure condition, and the second GaAs layer 22 may be formed under a second pressure condition lower than the first pressure condition.

After forming a lattice matching layer 40 on the substrate 10, the multilayered GaAs structure 20 may be formed on the lattice matching layer 40. The lattice matching layer 40 mitigates a lattice mismatch between the substrate 10 and the multilayered GaAs structure 20. For example, when a Si substrate is employed as the substrate 10, the lattice matching layer 40 may include Ge or GaP. The lattice matching layer 40 may have a single layer structure including Ge or GaP. The lattice matching layer 40 may have a multilayer structure including Ge or GaP. For example, Ge and GaAs are lattice-matching materials, but an APB dislocation problem may occur. By forming the multilayered GaAs structure 20 on the lattice matching layer 40, the APB dislocation may be effectively reduced. In order to effectively reduce the APB dislocation, the substrate 10 may be a substrate in which a crystal direction is inclined within a range of about 1° to about 35°.

First, referring to FIG. 6A, a substrate 10 is prepared. The substrate 10 may include, for example, a Si substrate, a glass substrate, or the like. The substrate 10 may be a substrate in which the crystal direction is inclined by about 1° to about 35°. In an example embodiment, a Si substrate in which a crystal direction is inclined by 4° is used as the substrate 10. A lattice matching layer 40 is formed on the substrate 10. The lattice matching layer 40 may include, for example, at least one of Ge and GaP. In an example embodiment, the lattice matching layer 40 is formed by stacking Ge on the substrate 10. The method of stacking Ge is not specifically limited. Si and GaAs used as the substrate 10 are materials having a large lattice mismatch. A Ge layer or a GaP layer as the lattice matching layer 40 is formed between Si and GaAs, and thus, a lattice mismatch between Si and GaAs is mitigated, and, as it will be described later, the multilayered GaAs structure 20 having a high quality surface may be obtained.

Next, the multilayered GaAs structure 20 is formed on the lattice matching layer 40. In an example embodiment, the multilayered GaAs structure 20 having a two-layer structure is formed. First, as shown in FIG. 6B, the first GaAs layer 21 is formed by epitaxially growing GaAs on the lattice matching layer 40 under a first pressure condition. Then, as shown in FIG. 6C, the second GaAs layer 22 is formed on the first GaAs layer 21 by epitaxially growing GaAs under a second pressure condition lower than the first pressure condition. The first pressure condition may be, for example, in a range from about 200 mbar to about 400 mbar. The second pressure condition may be, for example, in a range from about 80 mbar to about 100 mbar. Temperatures for growing the first GaAs layer 21 and the second GaAs layer 22 may be the same or different from each other. For example, the crystal-growing temperature may be in a range from about 600° C. to about 700° C. As a crystal-growing method, various growing methods, such as a chemical vapor deposition method and a physical vapor deposition method, may be employed. Accordingly, the multilayered GaAs structure 20 may be formed. The first GaAs layer 21 may be a high density GaAs layer, and the second GaAs layer 22 may be a low density GaAs layer.

Table 1 shows a result of measuring the surface roughness of the multilayered GaAs structure 20. Ge/GaAs is a case in which a single GaAs layer is formed on the lattice matching layer 40 of Ge. Ge/GaAs/GaAs is a case in which two GaAs layers are formed on the lattice matching layer 40 of Ge. As the substrate 10, a Si substrate in which a crystal direction is inclined by 4° is used.

TABLE 1

|  | Temperature (° C.) | Pressure (mbar) | Surface roughness (Ra, nm) |
| --- | --- | --- | --- |
| Ge/GaAs | 650 | 80 | 5.19 |
|  | 675 | 80 | 5.5 |
| Ge/GaAs/GaAs | 650 | 200/80 | 0.544 |
|  | 650 | 300/80 | 0.368 |
|  | 650 | 400/80 | 0.294 |

In the case of a single layer structure of Ge/GaAs, even if the temperature is changed under a given pressure condition, the effect of improving the surface roughness may not be obtained. On the other hand, in the two-layer structure of Ge/GaAs/GaAs, when the GaAs layers are respectively formed under a high pressure condition and a low pressure condition under a given temperature condition, the surface roughness of GaAs of the upper layer is about 1/10 to that of the single layer structure of Ge/GaAs. That is, according to the multilayered GaAs structure 20, a buffer layer having a high-quality surface may be obtained, and the defects that may occur during crystal-growing of the Group III-V compound semiconductor material for forming the light-emitting layer 30 may be reduced, and thus, the yield of the optical device 1 may be increased. In Table 1, the temperature conditions of the two-layer structure of Ge/GaAs/GaAs are the same, but may be different if necessary.

Figure 7:
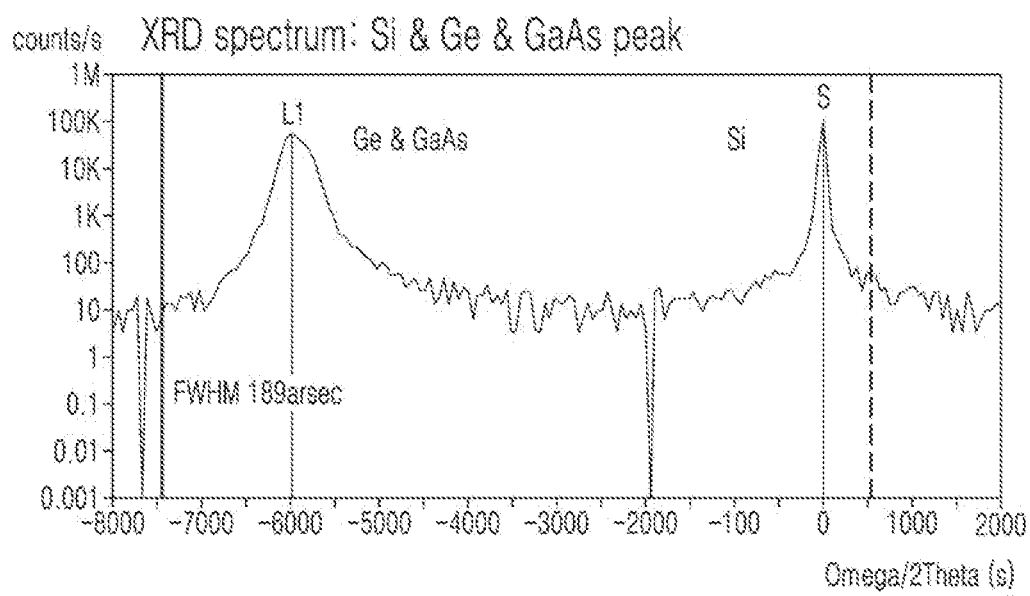
FIG. 7 is a graph showing an example of an X-ray diffraction spectrum (XRD) of a Si/Ge/2-GaAs structure.

Ge or GaP and GaAs are lattice matching materials, but an APB dislocation may occur. Because the multilayered GaAs structure 20 is formed, the problem of APB dislocation may be reduced or removed, and thus, the multilayered GaAs structure 20 having a high-quality surface may be obtained. FIG. 7 is a graph showing an example of an X-ray diffraction spectrum (XRD) of a Si/Ge/2-GaAs structure. Referring to FIG. 7, it may be seen that a multilayered GaAs structure 20 having a two-layer structure of FWHM 189 arcsec quality may be formed. According to a process of forming the multilayered GaAs structure 20 under high pressure and low pressure conditions, a high-quality multilayered GaAs structure 20 having a very low surface roughness of, for example, Ra 1.0 nm or less may be obtained, and thus, the quality of the light-emitting layer 30 formed by using the multilayered GaAs structure 20 as a buffer layer may be improved, and the yield of forming the light-emitting layer 30 in a subsequent process may be improved.

Next, the light-emitting layer 30 is formed on the multilayered GaAs structure 20. As described above, the light-emitting layer 30 may be formed by growing a Group III-V compound semiconductor material. The light-emitting layer 30 may include, for example, GaInP, AlGaInP, GaAs, GaInAs, AlGaAs, or AlGaInAs. A variety of known processes may be used to form the light-emitting layer 30, and the process will be briefly described below.

As an example embodiment, a first contact layer 31 is formed on the multilayered GaAs structure 20, the first contact layer 31 including a conductive material. Next, the first clad layer 32, the multi-quantum well structure 33, and the second clad layer 34 are sequentially formed on the first contact layer 31 by crystal-growing a Group III-V compound semiconductor material. Then, the second contact layer 39 is formed on the second clad layer 34, the second contact layer 39 including a conductive material, and thus, the optical device 1 having the light-emitting layer 30 as shown in FIG. 2 may be manufactured.

A composition ratio of the semiconductor material included in the quantum barrier layer QB and the quantum well layer QW may be appropriately selected so as to achieve lattice matching with the multilayered GaAs structure 20. For example, the quantum well layer QW and the quantum barrier layer QB may include one material selected from GaAs, GaIn$_x$As (0.05≤x≤0.35), GaInxP (0.3≤x≤0.7), Al$_y$GaIn$_x$P (0.3≤x≤0.7 and 0.05≤y≤0.95), Al$_y$GaAs (0.05≤y≤0.95), GaAs$_z$P (0.4≤z≤0.95), or AlAs$_z$P (0.4≤z≤0.95). For example, when light (red light) in a wavelength range of about 600 nm to about 690 nm is generated, the GaInP/AlGaInP multi-quantum well structure 33 may be applied. For example, when light (near infrared light) in a wavelength range of about 690 nm to about 1050 nm is generated, a multi-quantum well structure 33 of GaAs/AlGaAs may be applied.

The first clad layer 32 and the second clad layer 34 may include the same material as the quantum barrier layer QB of the multi-quantum well structure 33. For example, when the multi-quantum well structure 33 of GaInP/AlGaInP is applied to the optical device 1, the first and second clad layers 32 and 34 may include AlGaInP, and when the multi-quantum well structure 33 of GaAs/AlGaAs is applied to the optical device 1, the first and second clad layers 32 and 34 may include AlGaAs.

As an example embodiment, a first contact layer 31 including a conductive material is formed on the multilayered GaAs structure 20. Next, the multi-quantum well structure 33, the second clad layer 34, and a current diffusion layer 35 are sequentially formed on the first contact layer 31 by crystal-growing a Group III-V compound semiconductor material. Then, the second contact layer 39 is formed on the current diffusion layer 35, the second contact layer 39 including a conductive material, and thus, the optical device 1 having the light-emitting layer 30 as shown in FIG. 3 may be manufactured.

The current diffusion layer 35 is provided for facilitating the injection of a current from the second contact layer 39 to the multi-quantum well structure 33 and may include a Group III-V compound semiconductor material, for example, GaP, GaAs, GaInxP (0.3≤x≤0.7), Al$_y$GaAs (0.05≤y≤0.95), and Al$_y$In$_x$P (0.3≤x≤0.7 and 0.05≤y≤0.95). The current spreading layer 35 may be doped p-type or n-type. As a dopant, for example, Si, Zn, C, Mg, etc. may be used.

As an example embodiment, a first contact layer 31 is formed on the multilayered GaAs structure 20, the first contact layer 31 including a conductive material. Next, a first reflective layer 36, the first clad layer 32, the multi-quantum well structure 33, the second clad layer 34, and a second reflective layer 37 are sequentially formed on the first contact layer 31 by crystal-growing a Group III-V compound semiconductor material. Then, the second contact layer 39 is formed on the second reflective layer 37, the second contact layer 39 including a conductive material, and thus, the optical device 1 having the light-emitting layer 30 as shown in FIG. 4 may be manufactured.

The first and second reflective layers 36 and 37 may be distributed Bragg reflectors (DBRs) in which a low refractive index layer having a relatively low refractive index and a high refractive index layer having a relatively high refractive index are alternately stacked. For example, the first and second reflective layers 36 and 37 may be formed by alternately stacking Al$_{y1}$GaAs (0≤y1≤0.95) and Al$_{y2}$GaAs (0.05≤y2≤1). The first and second reflective layers 36 and 37 may be doped to have electrical conductivity. As a dopant, for example, Si, Zn, C, Mg, etc. may be used.

As an example embodiment, by sequentially vertically stacking the light-emitting layer 30a and the light-emitting layer 30b on the multilayered GaAs structure 20 by using the process of manufacturing the light-emitting layer 30 described above, the optical device 1 as shown in FIG. 5 may be manufactured. The light-emitting layer 30a and the light-emitting layer 30b may have a symmetrical structure, and one of the first contact layer 31 and the second contact layer 39 may be common to the light-emitting layer 30a and the light-emitting layer 30b.

As an example, an optical device for generating light in a wavelength band of 650 nm having a 4° inclined structure of Si substrate/Ge layer/first GaAs layer/second GaAs layer/n-contact layer/AlGaAs DBR layer/AlGaLnP clad layer/GaInP—AlGaInP multi-quantum well structure/AlGaLnP clad layer/AlGaAs DBR layer/p-AlGaAs current diffusion layer/p-contact layer is manufactured by the above manufacturing method. The composition of each layer is as follows.

Quantum well layer: Ga$_{0.57}$In$_{0.43}$P, thickness 7.5 nm

Quantum barrier layer: (Al$_{0.5}$Ga$_{0.5}$)$_{0.52}$In$_{0.48}$P, thickness 12 nm Clad layer: (Al$_{0.7}$Ga$_{0.3}$)$_{0.52}$In$_{0.48}$P, thickness 50 nm Current diffusion layer: p-GaP or p-Al$_{0.55}$Ga$_{0.45}$As, thickness (9/4)λ

Figure 8:
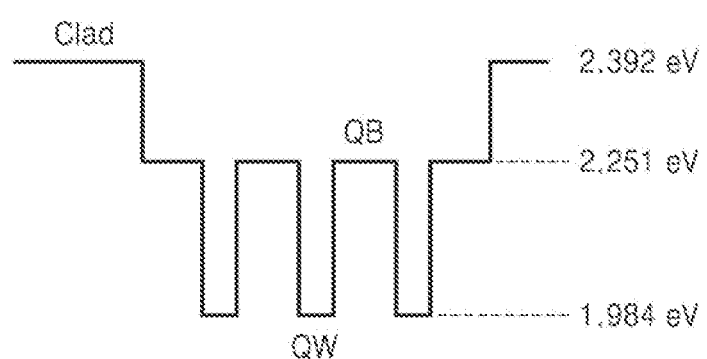
FIG. 8 is a diagram showing an example of band gap energy of an optical device according to an example embodiment.
Figure 9:
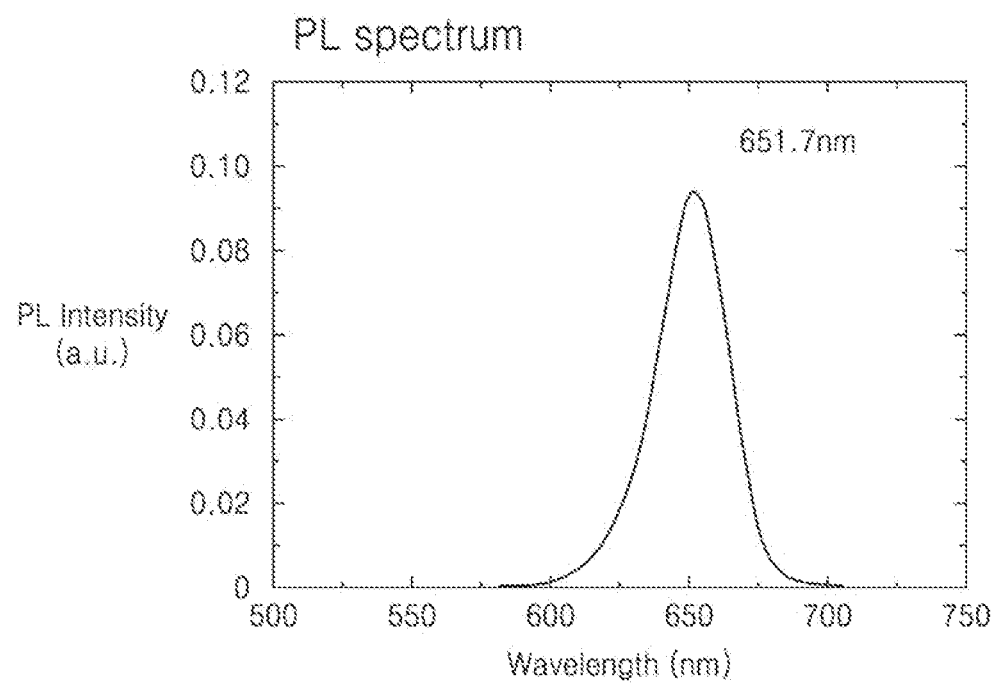
FIG. 9 is a graph showing an example of a photoluminescence spectrum of an optical device according to an example embodiment.

FIG. 8 is a diagram showing an example of band gap energy of an optical device by the above composition. FIG. 9 is a graph showing a photoluminescence spectrum by the optical device. Referring to FIG. 8, the quantum barrier layer QB has a band gap energy of about 2.251 eV, and the quantum well layer QW has a band gap energy of about 1.984 eV. The clad layer has a band gap energy of about 2.392 eV. Referring to FIG. 9, it may be seen that an emission peak is shown at a wavelength of about 651.7 nm.

Figure 10:
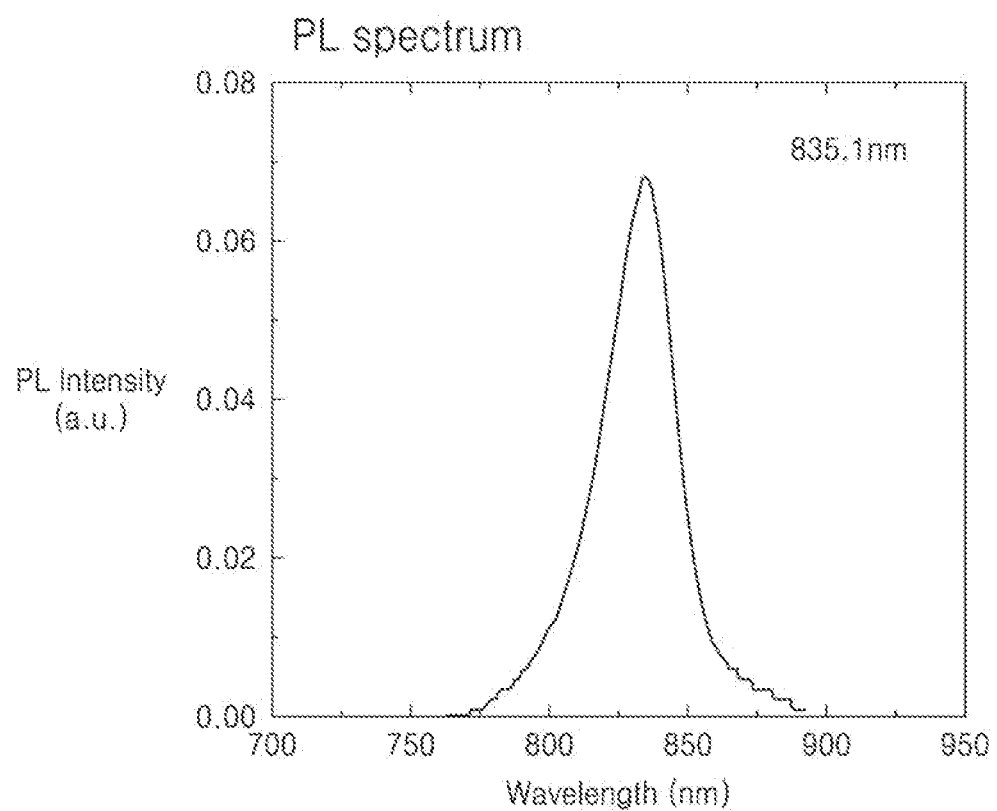
FIG. 10 is a graph showing an example of a photoluminescence spectrum of an optical device according to an example embodiment.

As an example, an optical device for generating light in a wavelength band of 835 nm having a 4° inclined structure of Si substrate/Ge layer/first GaAs layer/second GaAs layer/n-contact layer/AlGaAs DBR layer/AlGaInAs clad layer/GaAs—AlGaAs multi-quantum well structure/AlGaInAs clad layer/AlGaAs DBR layer/p-AlGaAs current diffusion layer/p-contact layer is manufactured by the above manufacturing method. FIG. 10 is a graph showing a photoluminescence spectrum by the optical device. Referring to FIG. 10, it may be seen that an emission peak is shown at a wavelength of about 835.1 nm.

Instead of the light-emitting layer 30, an optical structure layer that may be manufactured based on GaAs, such as a laser diode, an optical detector, a solar cell, and an optical modulator, etc. may be formed on the multilayered GaAs structure 20.

As a substrate, a substrate having a relatively low price and high strength compared to a GaAs substrate may be used, and thus, a process yield may be improved and the cost of the optical device may be reduced.

Because a high-quality GaAs structure having a multi-layer structure may be formed, a variety of high-quality optical structure layers including a Group III-V compound semiconductor material may be formed.

Figure 11:
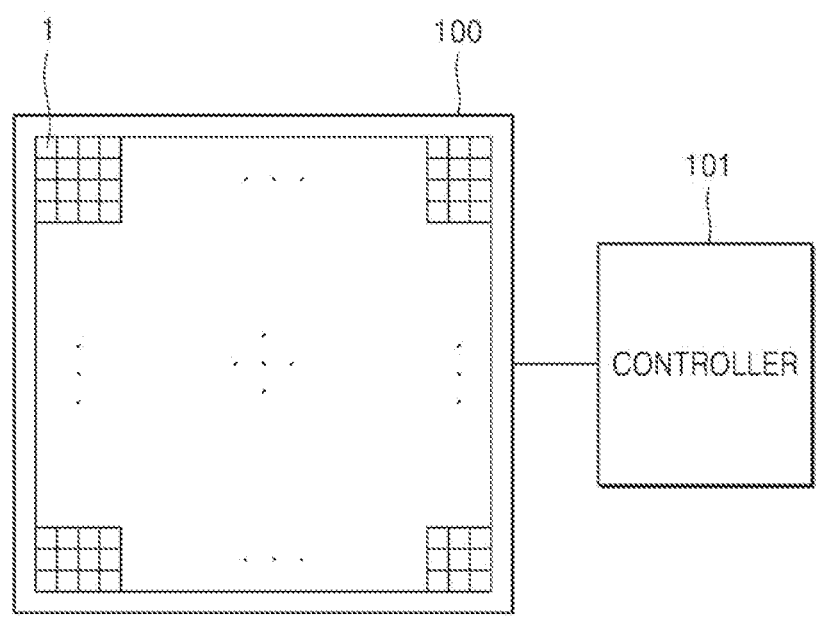
FIG. 11 is a diagram showing a schematic configuration of an optical device according to an example embodiment.

FIG. 11 is a diagram showing a schematic configuration of an optical device according to an example embodiment. The optical device is a display device including a plurality of optical devices 1. Referring to FIG. 11, the display device may include a display unit 100 including the plurality of optical devices 1 arranged in a two-dimensional array, and a controller 101 configured to control the display unit 100. The plurality of optical devices 1 may have a structure as shown in any of FIGS. 1 to 5. The controller 101 may reproduce a desired image on the display unit 100 by individually controlling the plurality of optical devices 1.

As described above, the optical device according to the disclosure and the method of manufacturing the optical device have been described with reference to the example embodiments shown in the drawings, but these are only examples, and therefore, it will be understood by those skilled in the art that various changes in form and details may be made therein without departing from the spirit and scope of the disclosure. Accordingly, the scope of the disclosure is defined not by the detailed description but by the appended claims.

It should be understood that example embodiments described herein should be considered in a descriptive sense only and not for purposes of limitation. Descriptions of features or aspects within each embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A method of manufacturing an optical device, the method comprising:
    forming a multilayered GaAs structure on a substrate by growing at least two GaAs layers, wherein a first condition during growing a first GaAs layer of the at least two GaAs layers is different from a second condition during growing a second GaAs layer of the at least two GaAs layers, and each of the first condition and the second condition comprises at least one of a pressure and a temperature; and
    forming a light-emitting layer by growing a Group III-V compound semiconductor material on the multilayered GaAs structure,
    wherein a density of the first GaAs layer is higher than a density of the second GaAs layer.

2. The method of claim 1, wherein, in the forming the multilayered GaAs structure, the pressure is lowered from growing a lowermost GaAs layer of the at least two GaAs layers to growing an uppermost GaAs layer of the at least two GaAs layers.

3. The method of claim 1, wherein the forming the multilayered GaAs structure comprises:
    forming the first GaAs layer under a first pressure condition; and
    forming the second GaAs layer on the first GaAs layer under a second pressure condition lower than the first pressure condition.

4. The method of claim 1, further comprising forming a lattice matching layer on the substrate to mitigate a lattice mismatch between the substrate and the multilayered GaAs structure.

5. The method of claim 4, wherein the substrate comprises a Si substrate, and
    the lattice matching layer comprises at least one of a Ge layer and a GaP layer.

6. The method of claim 5, wherein a crystal direction of the Si substrate is inclined in a range of about 1° to about 35° with respect to a surface of the substrate.

7. The method of claim 1, wherein the light-emitting layer comprises a multi-quantum well structure.

8. The method of claim 7, wherein the Group III-V compound semiconductor material comprises at least one of GaInP, AlGaInP, GaAs, GaInAs, AlGaAs, and AlGaInAs.

9. The method of claim 7, wherein the forming the light-emitting layer comprises forming a plurality of light-emitting layers stacked in a vertical direction on the multilayered GaAs structure.

* * * * *